(12) United States Patent
Carpenter et al.

(10) Patent No.: US 7,864,625 B2
(45) Date of Patent: Jan. 4, 2011

(54) OPTIMIZING SRAM PERFORMANCE OVER EXTENDED VOLTAGE OR PROCESS RANGE USING SELF-TIMED CALIBRATION OF LOCAL CLOCK GENERATOR

(75) Inventors: Gary D. Carpenter, Austin, TX (US);
Jente B. Kuang, Austin, TX (US);
Kevin J. Nowka, Georgetown, TX (US);
Liang-Teck Pang, Albany, CA (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 12/244,286

(22) Filed: Oct. 2, 2008

(65) Prior Publication Data
US 2010/0085823 A1 Apr. 8, 2010

(51) Int. Cl.
*G11C 8/18* (2006.01)
*G11C 8/00* (2006.01)
*G11C 7/00* (2006.01)

(52) U.S. Cl. .............. 365/233.12; 365/194; 365/233.1
(58) Field of Classification Search .............. 365/233.1, 365/233.12
See application file for complete search history.

(56) References Cited

U.S. PATENT DOCUMENTS

| 5,389,843 | A | 2/1995 | McKinney | |
|---|---|---|---|---|
| 5,596,539 | A | 1/1997 | Passow et al. | |
| 6,417,715 | B2* | 7/2002 | Hamamoto et al. | 327/291 |
| 6,549,041 | B2* | 4/2003 | Waldrop | 327/5 |
| 6,760,269 | B2 | 7/2004 | Nakase et al. | |
| 6,889,336 | B2* | 5/2005 | Schoenfeld et al. | 713/503 |
| 7,212,053 | B2* | 5/2007 | Gomm et al | 327/158 |
| 7,495,487 | B2* | 2/2009 | Ma et al. | 327/158 |
| 2005/0041486 | A1* | 2/2005 | Cooper | 365/194 |
| 2005/0237848 | A1 | 10/2005 | Takahashi et al. | |
| 2008/0037338 | A1 | 2/2008 | Chen et al. | |

FOREIGN PATENT DOCUMENTS

JP 3157011 5/1991

OTHER PUBLICATIONS

D. Sengupta et al., "Generalized Power-Delay Metrics in Deep Submicron CMOS Designs," IEEE Transactions on Computer-Aided Design of Integrated Circuits and Systems, vol. 26, No. 1, Jan. 2007.
K. Osada et al., "Universal-Vdd 0.65-2.0V 32 kB cache using voltage-adapted timing-generation scheme and a lithographical-symmetric cell," ISSCC, Feb. 2001 pp. 168-169, 443.

* cited by examiner

*Primary Examiner*—Son L Mai
(74) *Attorney, Agent, or Firm*—Libby Z. Handelsman; Jack V. Musgrove

(57) ABSTRACT

A delay circuit has a fixed delay path at a lower voltage level, a level converter, and an adjustable delay path at a higher voltage level. The fixed delay path includes an inverter chain, and the adjustable delay path includes serially-connected delay elements selectively connected to the circuit output. In an application for a local clock buffer of a static, random-access memory (SRAM), the lower voltage level is that of the local clock buffer, and the higher voltage level is that of the SRAM. These voltages may vary in response to dynamic voltage scaling, requiring re-calibration of the adjustable delay path. The adjustable delay path may be calibrated by progressively increasing the read access time of the SRAM array until a contemporaneous read operation returns the correct output, or by using a replica SRAM path to simulate variations in delay with changes in voltage supply.

20 Claims, 6 Drawing Sheets

OPTIMIZING SRAM PERFORMANCE OVER EXTENDED VOLTAGE OR PROCESS RANGE USING SELF-TIMED CALIBRATION OF LOCAL CLOCK GENERATOR

BACKGROUND OF THE INVENTION

1. Field of the Invention

The present invention generally relates to clock or timing circuits, and more particularly to a method of operating a memory array such as static, random-access memory (SRAM) which uses locally generated clock signals.

2. Description of the Related Art

Integrated circuits are used for a wide variety of electronic applications, from simple devices such as wristwatches to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells, memory cells and input/output (I/O) cells.

Power usage has become a dominant concern in the development of integrated circuits for data processing systems. Low power circuits are becoming more prevalent due to power consumption problems. Low power designs are also preferable since they exhibit less power supply noise and can provide better tolerance with regard to manufacturing variations. Excess power usage is not only costly and inefficient, but also leads to heat management problems. Power dissipation has become a limiting factor for the yield of high-performance circuit designs (operating at frequencies around 1 gigahertz or more) with deep submicron technology. Modern microprocessor designs are accordingly dictated by the power constraint.

Clock nets between cells can contribute up to 50% of the total active power in multi-GHz designs. The power constraint thus presents an additional challenge for the designer in constructing a clock network for the cells, and this challenge is becoming more difficult with the latest technologies like low-power, 65-nanometer integrated circuits. There are several techniques for minimizing power while still achieving timing objectives for high performance, low power systems. One method involves the use of local clock buffers (LCBs) to distribute the clock signals. A typical clock control system has a clock generation circuit (e.g., a phase-lock loop) that generates a master clock signal which is fed to a clock distribution network that renders synchronized global clock signals at the LCBs. Each LCB adjusts the global clock duty cycle and edges to meet the requirements of respective circuit elements, e.g., local logic circuits, latches or memory arrays. Placing LCBs close to clocked circuits also reduces clock skew which helps improve the timing of the circuit.

Another approach to power management is dynamic voltage scaling where the voltage used in a given component is increased or decreased depending upon operational, process or environmental parameters. Dynamic voltage scaling is an efficient way to reduce both static and dynamic power, but a wide range of voltage is required to maintain proper operation of a circuit under different performance specifications, and different power/delay metrics typically have different optimum power supply voltages ($V_{dd}$).

The use of different voltages for different cells in a circuit combined with dynamic voltage scaling presents unique problems, especially with low voltage operations, since the delays of different cells scale differently at low voltages. For example, a static, random-access memory (SRAM) array which uses locally generated clock signals from an LCB may have a device threshold voltage ($V_{th}$) of 0.5 volts while the LCB operates at a device threshold voltage of 0.4 volts (memory typically has a higher $V_{th}$ for robustness and low leakage, and the peripheral control signal generation circuits have a lower $V_{th}$ for high speed operation). The delay in the SRAM will scale differently with varying voltage than the delay in the logic gates of the LCB due to wire loading in the SRAM versus device loading in the logic gates. This delay differential can be significant, negatively impacting manufacturing requirements and/or circuit performance.

Some circuits have a high sensitivity to variations at low voltage. In the example of SRAM control, the LCB generates a local clock signal and a delayed local clock signal which are buffered to generate the wordline, precharge and latching signals. The delayed local clock signal is obtained by delaying and extending the pulse width of the local clock signal using inverter chains. The most critical timing component in the SRAM control is the local clock signal pulse width which determines SRAM read and write time windows. However, it is very difficult to control this timing component with dynamic voltage scaling because of variations in inverter delay with changes in supply voltage and differences between threshold voltages. As a result the SRAM delay function does not track the LCB inverter delay function.

One potential solution to this problem is the use of programmable delay circuits, such as that described in U.S. Pat. No. 5,389,843. A series of multiplexers and delay elements are used to output a signal having an adjustable delay. A digital input value having N number of programmable bits is used to control the N delay stages of the circuit, that is, the bits are respective selectors for the multiplexers. While the number of delay elements may be selectively programmed with this circuit, there are still variations in the actual delay of these elements with respect to supply voltage which are only imprecisely known, so this approach is not feasible for devices that are particularly sensitive at low voltages.

Another solution is the use of "dummy" circuits to replicate the delay path. This approach is applied to memory control in U.S. Pat. Nos. 5,596,539 and 6,760,269. Sense amplifiers connected to dummy bit lines drive control lines that assert the memory array timing signals when a dummy cell has finished a read operation to provide precise data read timing. While this approach provides a real-time basis for delay adjustment, the delay variation of the replicated SRAM path may not match the delay variation in the LCB logic as explained above, resulting in poor timing control.

In light of the foregoing, it would be desirable to devise an improved method of calibrating local clock signals for sensitive circuits such as memory arrays. It would be further advantageous if the method could take into consideration both variations in delay due to power supply voltage and differences between threshold voltages for related circuit components.

SUMMARY OF THE INVENTION

It is therefore one object of the present invention to provide an improved clock generation circuit.

It is another object of the present invention to provide such a circuit that can be utilized in conjunction with dynamic voltage scaling for related integrated circuit components.

It is yet another object of the present invention to provide a method of optimizing SRAM performance over an extended voltage or process range using self-timed calibration of a local clock.

The foregoing objects are achieved using a delay circuit having a first delay component operating at a first voltage level which provides a fixed delay path to generate an intermediate delay signal from a clock input, a level converter which receives the intermediate delay signal at the first voltage level and raises it to a second voltage level which is higher than the first voltage level, and a second delay component providing an adjustable delay path which generates a delayed clock signal from the intermediate delay signal, wherein the second delay component operates at the second voltage level. The first delay component may include an inverter chain of fixed length, and the second delay component may include a plurality of serially-connected delay elements one of whose outputs is selectively connected to an output of the delay circuit. The delay elements may be for example inverters, AND gates, or NAND gates.

In the application of the delay circuit for a local clock buffer of a static, random-access memory (SRAM), the first voltage level is the same as a nominal voltage level of the local clock buffer, and the second voltage level is the same as a nominal voltage level of the SRAM. These voltages may vary in response to dynamic voltage scaling, requiring re-calibration of the adjustable delay path. The adjustable delay path may be calibrated by progressively increasing the read access time of the SRAM array until a contemporaneous read operation returns the correct output, or by using a replica SRAM path to simulate variations in delay with changes in voltage supply.

The delay elements along the adjustable delay path are selectively connected to the delay circuit output using switches controlled directly or indirectly by latches or shift registers. Only one of the latches or registers at any given time will have the logical state required to close a switch. In one embodiment, latches are clocked by a delay input signal from the replica SRAM path. In an alternative embodiment, the logical state which closes the switches advances through shift registers as the calibration signal is repeatedly activated to progressively increase the delay. The shift registers may be programmable.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention is directed to improved methods and integrated circuit structures for generating timing or clock signals. In particular the invention is applicable to timing control for circuit components which use local clock signals and a delayed clock signal, such as a static, random-access memory (SRAM) array. The invention provides precise adjustment of the delayed clock signal to optimize SRAM performance over an extended range of operational, process or environmental parameters.

Figure 1:
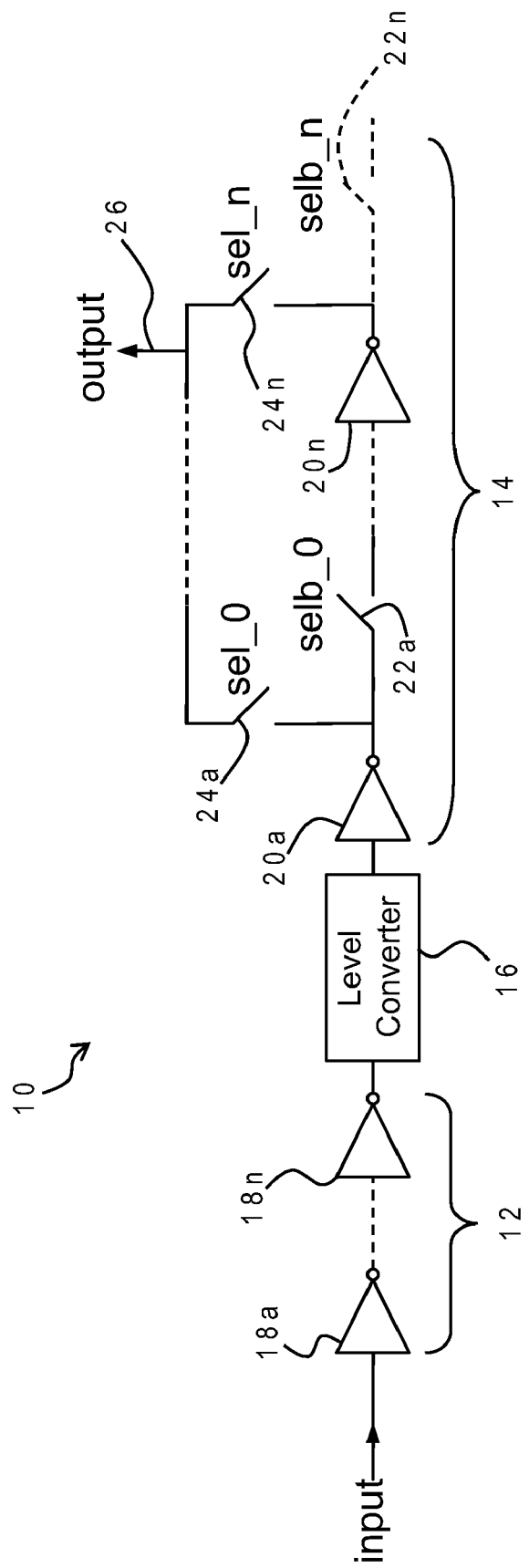
FIG. 1 is a schematic diagram of one embodiment of a delay circuit constructed in accordance with the present invention.

With reference now to the figures, and in particular with reference to FIG. 1, there is depicted one embodiment 10 of a delay circuit constructed in accordance with the present invention. Delay circuit 10 is generally comprised of an inverter chain 12 having a fixed length, a linear programmable delay residue 14 whose delay is selectively adjusted, and a level converter 16 interconnecting fixed inverter chain 12 to linear programmable delay residue 14. Inverter chain 12 includes a first plurality of serially connected inverters 18a, . . . , 18n. The first inverter 18a receives an input clock signal and the last inverter 18n outputs an intermediate delay signal to the input of level converter 16.

Inverter chain 12 operates at a first power supply voltage which is less that a second power supply voltage used for linear programmable delay residue 14. Level converter 16 accordingly raises the voltage of the intermediate delay signal from the first power supply voltage to the second power supply voltage for input to linear programmable delay residue 14. In an exemplary implementation for a local clock buffer which supplies clock signals to an SRAM array, the power supply for inverter chain 12 is nominally 0.4-0.5 volts, and the power supply for linear programmable delay residue 14 is nominally 0.5-0.6 volts which is the same as the power supply voltage for the SRAM array (both of these voltage levels may vary with dynamic voltage scaling). Using a higher voltage for linear programmable delay residue 14 allows smaller increments for increasing the overall delay of delay circuit 10. A higher voltage supply also provides a better model (in both hardware and simulation) for clock calibration. It is preferable to use the same power supply voltage as the SRAM array to consolidate power supplies for different integrated circuit components.

Linear programmable delay residue 14 includes a second plurality of serially connected inverters 20a, . . . , 20n, but each wire connection between successive inverters 20 has a first switch 22a, . . . , 22n, and a branch connection to a second switch 24a, . . . , 24n. The other nodes of second switches 24a, . . . , 24n are connected to an output line 26 which provides a delay or timing signal. The first set of switches 22a, . . . , 22n are opened and closed by programmable select bits sel_0, . . . , sel_n, and the second set of switches 24a, . . . , 24n are opened and closed by the complement of the select bits, i.e., selb_0, . . . , selb_n. Only one of the select bits is activated at any given time to close one switch and provide a single delay path through linear programmable delay residue 14. Switch 22n and its output are optionally provided for tiled circuit constructions.

Delay circuit 10 accordingly includes a first delay component from the fixed delay path along inverter chain 12 and a second delay component from the adjustable delay path through linear programmable delay residue 14 which are summed to derive a total delay amount. The relative amounts of fixed delay and adjustable delay may vary according to the particular implementation. The total delay amount is set to a desired delay by activating different select bits for the switches in linear programmable delay residue 14 to shorten or lengthen the adjustable delay path, and is chosen based on the particular purpose for which delay circuit 10 is employed. For example, when used for SRAM control the total delay amount is set to allow a proper time window for accessing the SRAM array. The desired delay can be determined by performing a calibration procedure that progressively increases the read access time of the SRAM array until a contemporaneous read operation returns the correct output, or that uses a replica SRAM path with overheads. Those skilled in the art will appreciate that delay circuit 10 can be used with other logic circuits besides SRAM which perform a logical evaluation, and can similarly be calibrated by a contemporaneous timed logic evaluation of the circuit component.

Figure 2:
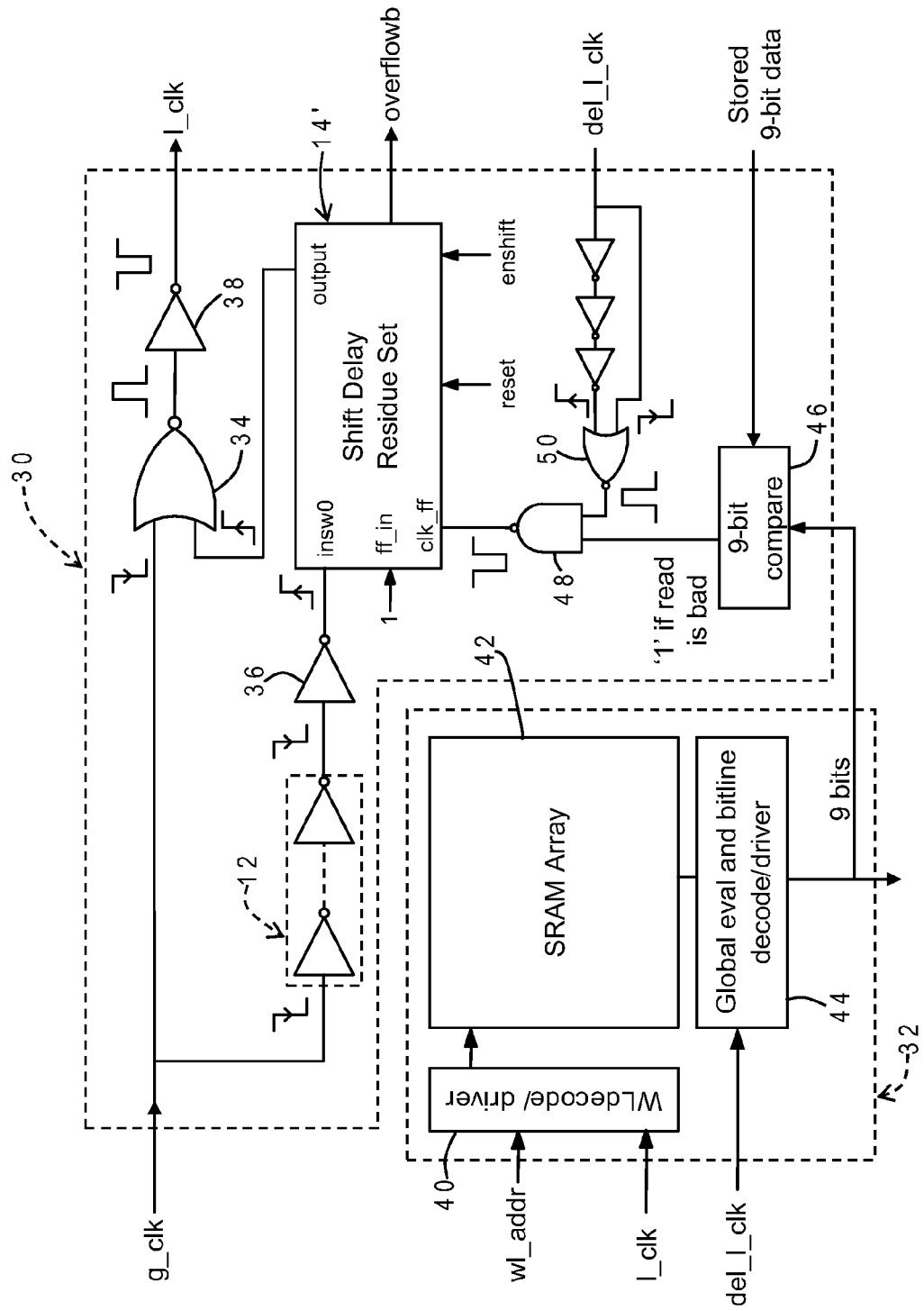
FIG. 2 is a schematic diagram of one embodiment of an adaptive pulse generator constructed in accordance with the present invention which may be used with the delay circuit of FIG. 1.

One such calibration procedure for determining the specific delay adjustment is described in conjunction with FIG. 2 which illustrates one embodiment of an adaptive pulse generator for a local clock buffer 30 of an SRAM subsystem 32 constructed in accordance with the present invention. Local clock buffer 30 and SRAM subsystem 32 are located on a single integrated circuit chip. Local clock buffer 30 receives a global clock signal (g_clk), and generates a launch clock signal (l_clk). The global clock signal is an input to a NOR gate 34 and is also an input to a delay circuit which includes a fixed delay path through an inverter chain 12' and an adjustable delay path through a shift delay residue set circuit 14' (described further below in conjunction with FIG. 3). The delay circuit includes a level-converting inverter 36 as a front end device for shift delay residue set circuit 14'. The timing signal output from shift delay residue set circuit 14' is connected to the other input of NOR gate 34. The output signal from NOR gate 34, which is connected to another inverter 38, thus has the same frequency as the global clock signal but its pulse width is modulated by the delay time and width of the timing signal. Inverter 38 is used to correct the polarity of the signal from NOR gate 34, and its output is the launch clock signal.

The launch clock signal is an input to a word line decode/driver circuit 40 of SRAM subsystem 32. Word line decode/driver circuit 40 receives a word line address for a requested memory block and energizes the corresponding word line of an SRAM array 42 while the launch clock is active. A global evaluate and bitline decode/driver 44 senses the values in the targeted memory cells and outputs the memory block to the requesting entity, e.g., a microprocessor. The global evaluate logic in block 44 evaluates the bitlines when a delayed launch clock signal (del_l_clk) is active. The delayed launch clock signal is generated by an identical scheme that produces the launch clock signal (l_clk) but with a pre-calculated delay time (e.g., from an additional inverter chain) corresponding to the signal propagation delay from the local bitlines of SRAM array 42 to its global bitlines.

A read operation on SRAM array 42 is used to provide feedback on the sufficiency of the relative delay and pulse widths of the current clock signals. The read operation may be carried out using a regular word line of SRAM array 42, or using a special set of memory cells in SRAM array 42 provided for this purpose. The cells which receive the test pattern are preferably located proximate the physical center of SRAM array 42. In the exemplary embodiment nine bits comprising a test pattern are written to the designated address in SRAM array 42 and thereafter are read out by global evaluate and bitline decode/driver 44. These write and read operations are initiated by a microprocessor or other control logic of the integrated circuit. A tap off the output of global evaluate and bitline decode/driver 44 feeds these nine bits to the first input of a comparator 46 in local clock buffer 30. Comparator 46 also receives stored 9-bit data at a second input, and compares the stored data to the nine bits from the contemporaneous evaluation. The nine bits for the second input may be stored in holding latches that are set at the factory, or are programmably set by a scan chain of the integrated circuit.

If the comparison shows that all nine bits match, then the read operation was successful, i.e., the read time window was sufficiently long, and no further adjustment of the delay clock signal is necessary; in such a case comparator 46 outputs a logical "0" to a NAND gate 48. If the comparison reveals a mismatch in any of the nine bits, then the read operation requires a larger window of time, i.e., the pulse width of the delayed launch clock signal is less than the desired pulse width so the delayed launch clock signal needs to be adjusted; in this case the output of comparator 46 is a logical "1". The other input to NAND gate 48 is a chopped signal from another NOR gate 50. The chopped signal is derived by introducing a further delay to the delayed launch clock signal and inverting this further delayed signal, then combining it with the delayed launch clock signal. The inverted pulse width of the chopped signal from NOR gate 50 (when the signal is logical low) will be wider when the pulse width of the delayed launch clock signal is narrow, and will be narrower when the pulse width of the delayed launch clock signal is wide. NAND gate 48 outputs a clock calibration signal (clk_ff) which is active unless the 9-bit comparison failed and the output of NOR gate 50 is active. Shift delay residue set circuit 14' uses the calibration signal to increase the delay and generate a wider pulse width.

Figure 3:
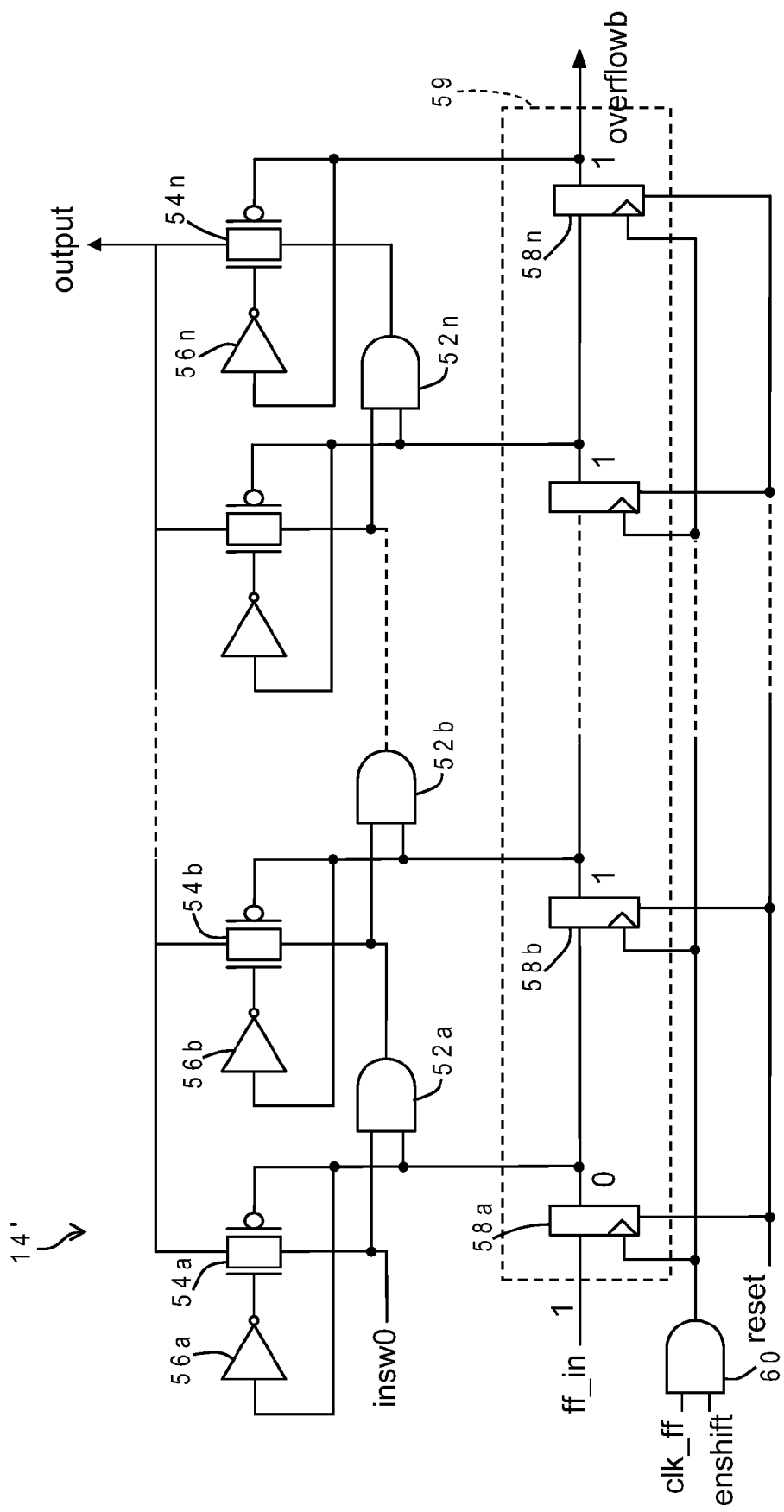
FIG. 3 is a schematic diagram of one embodiment of a shift delay residue set circuit constructed in accordance with the present invention which may be used with the adaptive pulse generator of FIG. 2.

Shift delay residue set circuit 14' is shown in further detail in FIG. 3, and includes an adjustable delay path provided by a plurality of serially connected AND gates 52a, 52b, ... 52n. Different delays are again chosen by selectively activating switches that connect the outputs of the AND gates to the timing signal output of shift delay residue set circuit 14'. In this embodiment each switch is comprised of an n-type field-effect transistor (nfet) coupled to a p-type field-effect transistor (pfet), i.e., the source of the nfet is connected to the source of the pfet and the drain of the nfet is connected to the drain of the pfet. The nfet gates of nfet/pfet pairs 54a, 54b, ..., 54n are controlled by respective inverters 56a, 56b, ..., 56n. The pfet gates of nfet/pfet pairs 54a, 54b, ..., 54n are controlled by respective shift registers (flip-flops) 58a, 58b, ..., 58n of a shift register circuit 59.

The intermediate delay signal from inverter 36 is connected to the source of nfet/pfet pair 54a and to one input of AND gate 52a, and the other input of AND gate 52a is connected to the output of shift register 58a. Similarly, the output of AND gate 52a is connected to the source of nfet/pfet pair 54b and to one input of AND gate 52b, and the other input of AND gate 52b is connected to the output of shift register 58b. These connections from an output of one AND gate to an input of the next AND gate repeat in seriatim. The output of the final AND gate 52n is connected to the source of nfet/pfet pair 54*n*. While this embodiment uses AND gates for the delay elements, other logic gates may be used such as NAND gates followed by inverters.

The input of shift register 58*a* is connected to a constant logic high signal (ff_in), and its output is connected to the input of shift register 58*b*. The connections from an output of one shift register to an input of the next shift register repeat in seriatim. Each shift register 58*a*, 58*b*, . . . , 58*n* is clocked (latched) by a signal from another AND gate 60. AND gate 60 receives inputs from the calibration signal (clk_ff) and an enable signal (enshift). The enable signal may be activated to re-calibrate the delayed clock signal in response to a change in the power supply voltage for SRAM 32 as a result of dynamic voltage scaling. When enshift is active, AND gate 60 will send a latching pulse to shift registers 58*a*, 58*b*, . . . , 58*n* each time a correction pulse is received from the clock calibration signal. The value in shift register 58*a* is initially set to zero (logic low) and the values in shift registers 58*b*, . . . , 58*n* are initially set to one (logic high) using a reset signal. These settings provides the shortest delay possible through nfet/pfet pair 54*a* without passing through any of the AND gates 52*a*, 52*b*, . . . , 52*n*. During calibration (when shifting is enabled) this zero value moves down the register chain with each repeated 9-bit comparison and the resulting activation of the calibration signal, which progressively increases the delay by selectively altering the delay path through one or more of AND gates 52*a*, 52*b*, . . . , 52*n*. The maximum delay is achieved when the zero value resides in the final shift register 58*n* with one's in the remaining shift registers, so the delay path passes through all of the AND gates 52*a*, 52*b*, . . . , 52*n*. The output of shift register 58*n* may also be used as an error signal (overflowb) to indicate when the maximum delay chain is still too short. For an illustrative embodiment with 45 nanometer technology, the fixed delay can be on the order of 50 picoseconds, the adjustable delay is in the range of 10 to 100 picoseconds, and the delay increment is in the range of 10 to 20 picoseconds.

Figure 4:
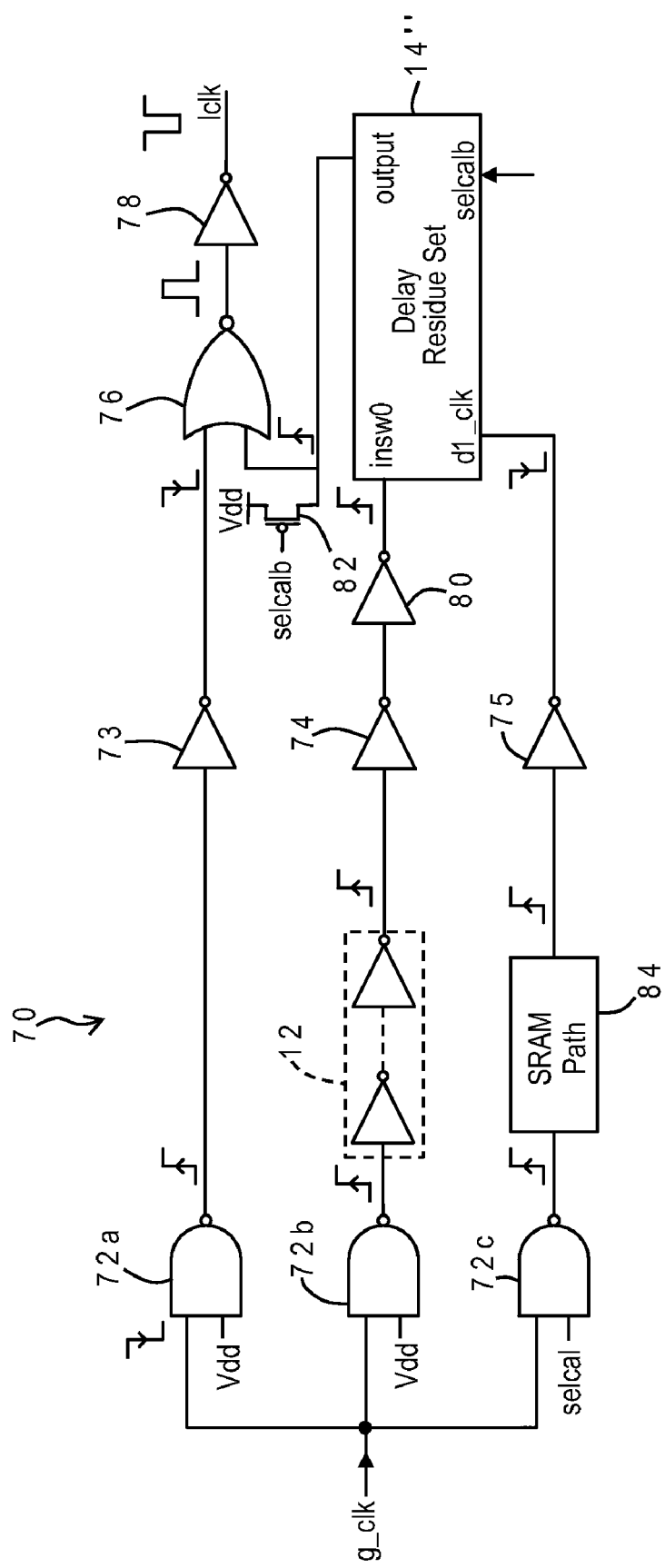
FIG. 4 is a schematic diagram of one embodiment of a self-timed local clock buffer constructed in accordance with the present invention using a replicated SRAM path.

The second calibration method noted above, using a replica SRAM path, is described in conjunction with FIG. 4 which illustrates one embodiment of a self-timed local clock buffer (LCB) 70 constructed in accordance with the present invention. The global clock signal is an input to three NAND gates 72*a*, 72*b*, 72*c*. The second inputs of NAND gates 72*a* and 72*b* are connected to logical high ($V_{dd}$). The output of NAND gate 72*a* is an input to an inverter 73 whose output is connected to a NOR gate 76. A timing output signal from a delay residue set circuit 14" is connected to the other input of NOR gate 76. The output signal from NOR gate 76, which is connected to another inverter 78, thus has the same frequency as the global clock signal but its pulse width is again modulated by the delay time and width of the timing output signal. Inverter 78 is used to correct the polarity of the signal from NOR gate 76, and its output is the launch clock signal. Those skilled in the art will appreciate that various inverters such as inverters 73 and 78 are used to set appropriate polarities of the signals based on the particular types of gates used in a given embodiment of self-timed LCB 70, and those inverters may be omitted or added to in alternative embodiments.

The output of NAND gate 72*b* drives inverter chain 12 which provides a fixed delay path. The intermediate delayed signal from inverter chain 12 passes through two other inverters 74, 80 which in this embodiment are both used for level conversion, i.e., inverter 74 raises the voltage level of the signal from the power supply level of inverter chain 12 to an intermediate voltage, and inverter 80 further raises the voltage level of the signal to the power supply level of delay residue set circuit 14".

The second input of NAND gate 72*c* is an enable signal (selcal), and the output of NAND gate 72*c* is connected to the replica SRAM path 84. SRAM path 84 tracks the delay of the functional SRAM memory for the current operational, process and environmental parameters using dummy circuits that have the same components as the functional SRAM. The use of dummy circuits instead of sensing bitlines of the functional SRAM memory itself avoids perturbation of the SRAM array. Several LCBs can be calibrated using only one replica SRAM path. The signal from SRAM path 84 passes through another inverter 75 which provides the SRAM delay input (dl_clk) to delay residue set circuit 14". The complement of the enable signal also controls a pfet 82 whose drain is connected to $V_{dd}$ (the power supply voltage for the local clock buffer) and whose source is connected to the second input of NOR gate 76, to disable delay modulation of the launch clock signal during calibration.

While NAND gate 72*c* or other logic having the enable signal as an input is essential to this implementation, NAND gates 72*a* and 72*b* are used only for timing purposes, to impart the same delay contribution of NAND gate 72*c* to their respective signal paths, and could be removed in alternative implementations.

Figure 5:
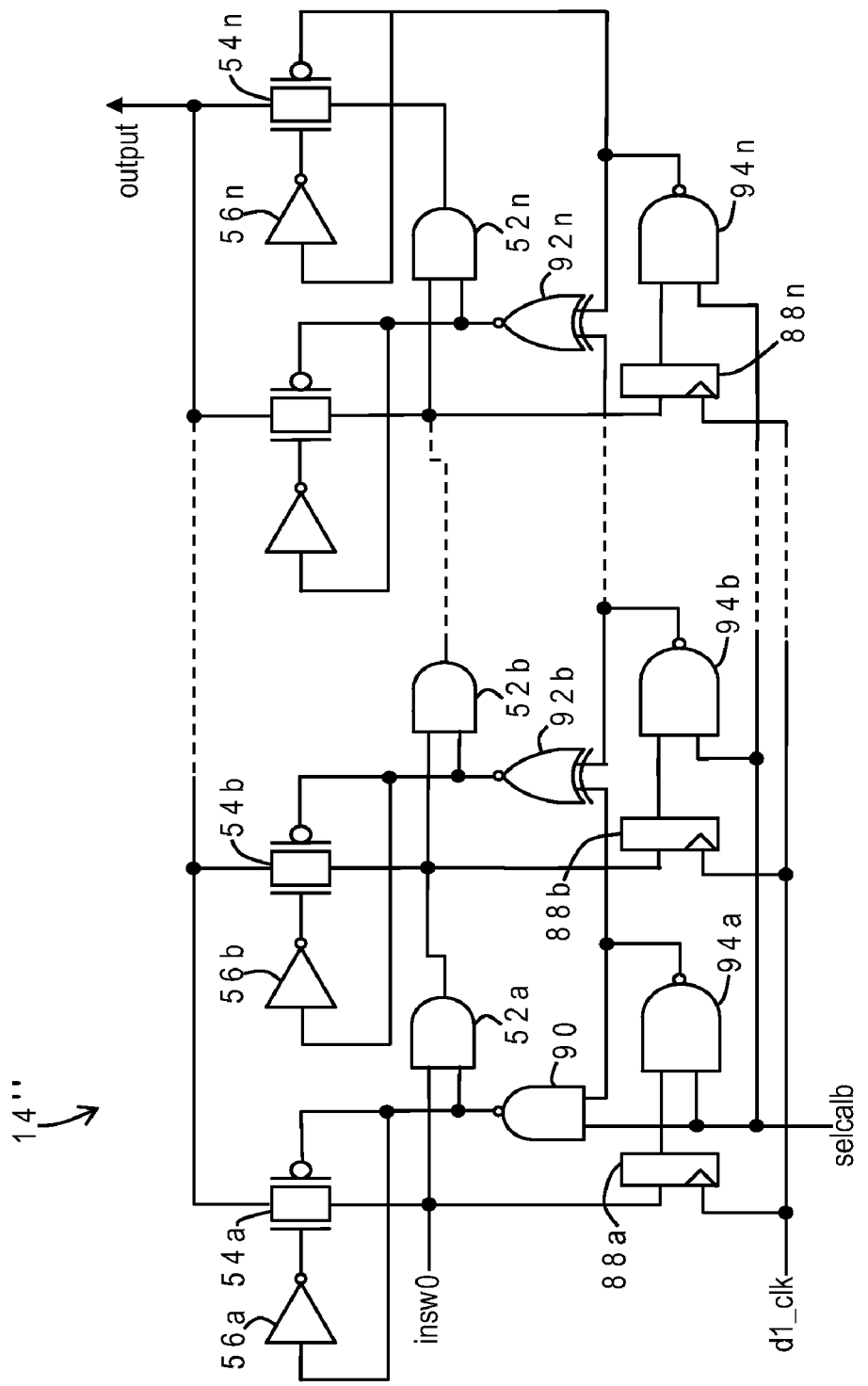
FIG. 5 is a schematic diagram of one embodiment of a delay residue set circuit constructed in accordance with the present invention which may be used with the self-timed local clock buffer of FIG. 4.

Delay residue set circuit 14" is shown in further detail in FIG. 5, and has an adjustable delay path similar to that in shift delay residue set circuit 14' of FIG. 2, including the plurality of serially connected AND gates 52*a*, 52*b*, . . . 52*n*, selectively interconnected to the circuit output by switches comprised of nfet/pfet pairs 54*a*, 54*b*, . . . , 54*n*, and inverters 56*a*, 56*b*, . . . , 56*n*. However, instead of shift registers the switches are now controlled by combinational logic whose inputs are the complement of the enable signal (selcalb) and outputs from a plurality of latches 88*a*, 88*b*, . . . , 88*n*. Latches 88*a*, 88*b*, . . . , 88*n* are clocked by the calibration signal, i.e., the SRAM delay signal (dl_clk). The intermediate delay signal from inverter 80 is an input to the first latch 88*a*, and a NAND gate 94*a* receives as inputs the complement of the self-calibration signal and the output of latch 88*a*. Similarly the output of AND gate 52*a* is an input to latch 88*b*, and another NAND gate 94*b* receives as inputs the self-calibration signal and the output of latch 88*b*. These connections from an output of one AND gate to an input of the next latch, and from that latch output to the next NAND gate whose other input is the complementary signal, repeat in seriatim until the output of the final NAND gate 94*n* is connected to the source of nfet/pfet pair 54*n*.

The output of NAND gate 94*a* is connected to an input of another NAND gate 90 and to an input of a NXOR gate 92*a*. The other input of NAND gate 90 is connected to the complement of the self-calibration signal, and the output of NAND gate 90 controls the first nfet/pfet pair 54*a*. Similarly, the output of the next NAND gate 94*b* is connected to the other input of NXOR gate 92*b* and to an input of the next NXOR gate (not shown), and the output of NXOR gate 92*b* controls the next nfet/pfet pair 54*b*. These connections from successive NAND gate outputs to successive NXOR gate inputs, and from the NXOR outputs to the nfet/pfet pairs repeat in seriatim until the output of the final NAND gate 94*n* is connected to the last input of NXOR gate 92*n* and to nfet/pfet pair 54*n*. When the self-calibration signal is not active (selcalb=$V_{dd}$), the intermediate delay signal (insw0) passes through the correct number of NAND delays to the circuit output as required to track the SRAM delay. For this exemplary implementation there are preferably 32 NAND gates in the delay chain, each providing about 10 picoseconds of delay at $V_{dd}$=0.9 volts.

Figure 6:
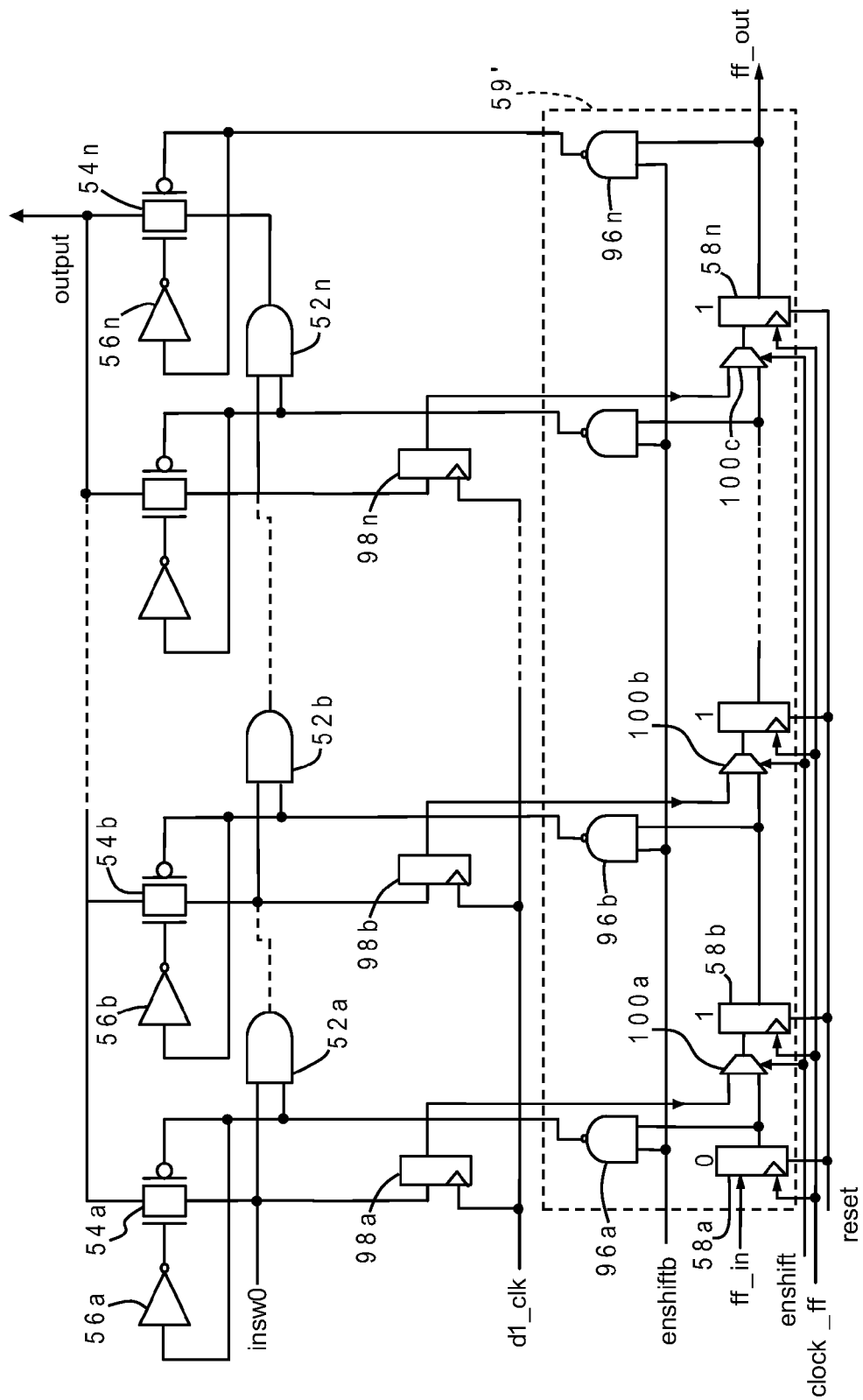
FIG. 6 is a schematic diagram of one embodiment of a programmable delay residue set circuit constructed in accordance with the present invention which may be used with the self-timed local clock buffer of FIG. 4.

With further reference to FIG. 6, the adjustable delay may alternatively be provided by a programmable delay residue set circuit 14''' which again has an adjustable delay path similar to that in shift delay residue set circuit 14' of FIG. 2 and delay residue set circuit 14'' of FIG. 5, including the plurality of serially connected AND gates 52a, 52b, ... 52n, selectively interconnected to the circuit output by switches comprised of nfet/pfet pairs 54a, 54b, ..., 54n, and inverters 56a, 56b, ..., 56n. In this alternative embodiment, however, the register chain stores a captured bit sequence, transfers this data out serially to be analyzed by an external circuit or machine, and then receives (loads) programming bits from the external circuit or machine which are used to select the proper switch 54 for a desired delay according to a preset function.

Programmable delay residue set circuit 14''' has another shift register circuit 59' which includes registers 58a, 58b, ..., 58n controlled (latched) by an independent clock signal (clock_ff). The frequency of the latching clock signal is not critical but is preferably generated from the global clock signal and has the same frequency. The first register 58a receives a programmable input signal (ff_in) and its output is connected to one input of a multiplexer 100a and to one input of a NAND gate 96a. The other input to multiplexer 100a is from the output of a latch 98a whose input is the intermediate delay signal (insw0). Latch 98a is clocked by the SRAM delay signal (dl_clk). Multiplexer 100a is controlled by a shift enable signal (enshift), and the complement of the shift enable signal is the other input to NAND gate 96a. The output of multiplexer 100a feeds register 58b. The output of NAND gate 96a controls nfet/pfet pair 54a and is also an input to the delay chain AND gate 52a. Similar connections are made along the register chain in seriatim, e.g., the output of the next register 58b is an input to the next multiplexer 100b and is an input to NAND gate 96b which also receives the complement of the shift enable signal, latch 98b receives the delay signal from AND gate 52a and its output is connected to the other input of multiplexer 100b which is controlled by the shift enable signal, and the output of NAND gate 96b controls nfet/pfet pair 54b. The output of the final register 58n is connected to one input of NAND gate 96n and also is the data output for the register chain (ff_out).

The value in shift register 58a is initially set to zero (logic low) and the values in shift registers 58b, ..., 58n are initially set to one (logic high) using a reset signal. A trial and error sequence may be used to capture the optimal bit pattern. Depending on the application, the delay residue set circuit could also have a combination of both external programmability and internal self-configuration.

The present invention thus provides an advantageous method for optimizing performance of a circuit which uses delayed clock signals without degrading performance optimality through the use of dynamic voltage scaling. Variations in the local clock delay accurately track variations in SRAM delay with a fixed small overhead (in an exemplary embodiment the maximum delay overhead is about 67 picoseconds at 0.5 volts). The invention thereby improves performance, lowers power and improves yield for processors and other very large scale integrated (VLSI) circuits.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been disclosed in the context of a self-timed local clock buffer for an SRAM memory, it is more broadly applicable to any circuit which depends on accurate control of the timing (pulse width and delay) of control signals, including optimization of pulse widths for latches, and dynamic logic to optimize pre-charge and evaluate times for a memory array. It is therefore contemplated that such modifications can be made without departing from the spirit or scope of the present invention as defined in the appended claims.

What is claimed is:

1. A delay circuit comprising:
   a circuit input for receiving a clock signal;
   a first delay component providing a fixed delay path which generates an intermediate delay signal from the clock signal, said first delay component operating at a first voltage level;
   a level converter which receives the intermediate delay signal from said first delay component at the first voltage level and raises the intermediate delay signal to a second voltage level which is higher than the first voltage level; and
   a second delay component providing an adjustable delay path which generates a delayed clock signal from the intermediate delay signal, said second delay component operating at the second voltage level.

2. The delay circuit of claim 1 wherein said first delay component includes an inverter chain of fixed length.

3. The delay circuit of claim 1 wherein said second delay component includes a plurality of serially-connected delay elements one of whose outputs is selectively connected to an output of the delay circuit.

4. The delay circuit of claim 1 wherein said delay elements are inverters.

5. The delay circuit of claim 1 used in a local clock buffer which controls timing of a static, random-access memory (SRAM), wherein:
   the first voltage level is the same as a voltage level of the local clock buffer; and
   the second voltage level is the same as a voltage level of the SRAM.

6. A clock circuit used for timing control of a circuit component in an integrated circuit chip, comprising:
   a circuit input for receiving a global clock signal;
   first circuit means connected to said circuit input for deriving a local clock signal from the global clock signal;
   second circuit means connected to said circuit input for deriving a delay timing signal from the global clock signal; and
   third circuit means for calibrating said second circuit means based on a contemporaneous timed logic evaluation of the circuit component.

7. The clock circuit of claim 6 wherein said first circuit means modulates the local clock signal using the delay timing signal.

8. The clock circuit of claim 6 wherein said second circuit means includes:
   a plurality of serially-connected delay elements;
   a plurality of switches which selectively connect said delay elements to an output of said second circuit means; and
   a plurality of registers respectively controlling said switches, only one of said registers having a logical state which closes a corresponding one of said switches.

9. The clock circuit of claim 6 wherein:
   the integrated circuit component is a static, random-access memory having a memory array, a word line driver which energizes a word line of the memory array, and a bitline decoder which outputs a memory block of the memory array;
   the local clock signal activates the word line driver; and a delayed clock signal derived from the global clock signal activates the bitline decoder.

10. The clock circuit of claim 6 wherein said third circuit means calibrates said second circuit means in response to a change in power supply voltage for the integrated circuit component.

11. A local clock buffer comprising:
a delay circuit having a fixed delay path which receives a global clock signal and generates an intermediate delay signal, an adjustable delay path which receives the intermediate delay signal and generates a delayed clock signal, and a reset line which sets a delay of said adjustable delay path to a minimum delay amount, wherein the delay of said adjustable delay path progressively increases in response to activation of a calibration signal;
combinational logic which generates a local clock signal based on the global clock signal modulated by the delayed clock signal; and
calibration logic which determines when a pulse width of the delayed clock signal is less than a desired pulse width and responsively activates the calibration signal.

12. The local clock buffer of claim 11 wherein said delay circuit includes:
a plurality of serially-connected delay elements;
a plurality of switches which selectively connect said delay elements to an output of said delay circuit, and
a plurality of shift registers respectively controlling said switches, wherein a logical state which closes said switches advances through said shift registers as the calibration signal is repeatedly activated to progressively increase the delay.

13. The local clock buffer of claim 12 wherein said delay elements are AND gates each of which has an input receiving an output of a respective one of said shift registers.

14. The local clock buffer of claim 11 wherein:
the local clock signal is used by a word line driver of a static, random-access memory (SRAM);
a delayed clock signal derived from the global clock signal is used by a bitline decoder of the SRAM; and
said calibration logic determines that the pulse width of the delayed clock signal is less than the desired pulse width by comparing a read value from said bitline decoder to a previously stored value.

15. The local clock buffer of claim 14 wherein the calibration signal is the logical NAND combination of a chopped signal derived from the delayed clock signal and a comparison signal.

16. A self-timed local clock buffer for a static, random-access memory (SRAM), comprising:
a circuit input which receives a global clock signal;
a first NAND gate having first and second inputs, said first input of said first NAND gate being connected to said circuit input, and said second input of said first NAND gate being connected to a self-calibration signal;
a replica SRAM path having an input connected to an output of said first NAND gate;
a second NAND gate having first and second inputs, said first input of said second NAND gate being connected to said circuit input, and said second input of said second NAND gate being connected to a power supply voltage;
an inverter chain having an input connected to an output of said second NAND gate;
a delay residue set circuit having a signal input, a delay input, and an enable input, said signal input being connected to an output of said inverter chain, said delay input being connected to an output of said replica SRAM path, and said enable input being connected to a complement of said self-calibration signal, wherein said delay residue set circuit generates a timing output signal from the signal input which is calibrated by the delay input when the self-calibration signal is active;
a third NAND gate having first and second inputs, said first input of said third NAND gate being connected to said circuit input, and said second input of said third NAND gate being connected to the power supply voltage;
a first inverter having an input connected to an output of said third NAND gate;
a NOR gate having first and second inputs, said first input of said NOR gate being connected to an output of said first inverter, and said second input of said NOR gate being connected to the timing output signal; and
a second inverter having an input connected to an output of said NOR gate, wherein an output of said second inverter provides a local clock signal for the SRAM.

17. The self-timed local clock buffer of claim 16 wherein said delay residue set circuit has an adjustable delay path which is selected using a plurality of serially-connected delay elements connected by switches to an output of said delay residue set circuit.

18. The self-timed local clock buffer of claim 17 wherein said delay residue set circuit further includes a plurality of latches which are clocked by the delay input, a first of said latches having an input which receives the signal input and remaining ones of said latches having inputs connected to respective outputs of said delay elements.

19. The self-timed local clock buffer of claim 17 wherein said switches are controlled by a plurality of programmable shift registers.

20. The self-timed local clock buffer of claim 19 wherein said shift registers are programmed by:
capturing a first bit sequence in said shift registers;
transferring the first bit sequence to an external circuit which analyzes the first bit sequence and selects a second bit sequence for a desired delay of the delayed clock signal according to a preset function; and
loading the second bit sequence from the external circuit into said shift registers.

* * * * *